United States Patent
Otsuka

(10) Patent No.: US 7,489,210 B2
(45) Date of Patent: Feb. 10, 2009

(54) SURFACE ACOUSTIC WAVE FILTER AND TRANSMITTER-RECEIVER

(75) Inventor: Eiichi Otsuka, Tokyo (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 152 days.

(21) Appl. No.: 11/541,512

(22) Filed: Sep. 29, 2006

(65) Prior Publication Data

US 2007/0075804 A1 Apr. 5, 2007

(30) Foreign Application Priority Data

Sep. 30, 2005 (JP) ............................. 2005-288027

(51) Int. Cl.
*H03H 9/00* (2006.01)
*H01L 41/00* (2006.01)
(52) U.S. Cl. ...................................... 333/133; 333/195
(58) Field of Classification Search ................. 341/133, 341/195; 333/133, 195
See application file for complete search history.

(56) References Cited

U.S. PATENT DOCUMENTS 5,721,519 A 2/1998 Onishi et al.
5,994,980 A 11/1999 Tada
6,335,667 B1* 1/2002 Takagi et al. ................. 333/195
6,828,879 B2* 12/2004 Tanaka et al. ................ 333/195
6,975,180 B2* 12/2005 Nakamura et al. ........... 333/133

FOREIGN PATENT DOCUMENTS

JP 8-065098 3/1996
JP 10-117123 5/1998

* cited by examiner

*Primary Examiner*—Jean B Jeanglaude
(74) *Attorney, Agent, or Firm*—Jordan and Hamburg LLP

(57) ABSTRACT

In order to realize low impedance of input and output by introducing unbalanced balanced input/output and reduction of the number of parts, and further in order to improve the out-of-band-characteristics, a structure such that two groups of longitudinal mode resonator type SAW filter units (3IDT-LCMR) having input and output phases different by 180 degrees from each other, is proposed. Central IDT electrodes of both SAW filter units are grounded at one terminal, and are connected at the other terminals in parallel to be an unbalanced input port. Two terminals whose phases are the same among four outer IDT electrodes of both SAW filter units, are connected in parallel to be a balanced output port. The outer IDT electrodes may be connected in parallel to be an unbalanced input port, and the central IDT electrodes may be connected in parallel to be a balanced output port. In addition, the output port may be unbalanced, and the input port may be balanced.

4 Claims, 6 Drawing Sheets

SURFACE ACOUSTIC WAVE FILTER AND TRANSMITTER-RECEIVER

BACKGROUND OF THE INVENTION

1. Field of the Invention

The present invention relates to a surface acoustic wave (SAW) filter which is installed on a vehicular terminal such as a cellular phone or the like and distinguishes a high frequency signal, and especially relates to a technical field of a surface acoustic wave filter which performs unbalanced balanced conversion of an input-output signal and makes it to a lower impedance.

2. Description of the Related

FIG. 5 shows an example of installing a surface acoustic wave filter on a front end portion of a vehicular terminal. In the present example, an antenna switch 2 is disposed immediately below an antenna 1, and on a reception side, the surface acoustic wave filter distinguishes received high frequency signals coming through the antenna switch 2 by a receive SAW filter unit 3 formed on a piezoelectric substrate. On a transmitting side, it outputs transmitting high frequency signals distinguished by a transmission SAW filter unit 4 to the antenna 1 via the antenna switch 2.

A reception output of the SAW filter unit 3 is to be an input of a receive amplifier (LNA: Low Noise Amplifier) 6 obtaining impedance matching by a matching circuit 5. Similarly, an output of a transmission amplifier (PA: Power Amplifier) 7 is to be an input of the SAW filter unit 4 obtaining impedance matching through a matching circuit 8.

The antenna switch 2 takes an unbalanced input-output circuit structure, whereas the receive amplifier 6 takes a balanced input circuit structure (for instance, a differential amplifying circuit). Therefore, the SAW filter unit 3 is made into a circuit structure to obtain a balanced output from an unbalanced input, the transmission amplifier 7 takes a balanced output circuit structure (for instance, high frequency transformer output). Accordingly, the SAW filter unit 4 is made into a circuit structure to obtain an unbalanced output from a balanced input.

As a circuit system enabling the unbalanced balanced conversion, there is a structure such that two 3IDT-LCMRs (3IDT type longitudinal Coupled mode resonator type SAW filter unit) which are 180 degrees different in input phase from each other, are electrically connected in parallel to serve as an input terminal, and a balanced terminal output is formed by electrically connecting the 3IDT-LCMRs in series to be an output, so that a balanced driving output having a high terminal impedance is obtained by using this series connection point as a ground lug (for instance, see Patent Document 1).

It should be noted that the 3IDT-LCMR is prepared by forming three IDTs (Inter Digital Transducer) 91 to 93 having a plurality of electrode fingers in the direction of propagation of the surface acoustic wave on a piezoelectric substrate, and by further providing reflectors 94 and 95 at the outermost thereof. As for the IDT 91 (93), a pair is formed by disposing comb electrodes 91$a$ (93$a$) and 91$b$ (93$b$) so as to engage with each other. The comb electrode 91$a$ (93$a$), which is one of the pair, is connected to, for instance, an input port 96, and the comb electrode 91$b$ (93$b$), which is the other of the pair, is grounded, for instance. Further, as for the IDT 92, a pair is formed by disposing comb electrodes 92$a$ and 92$b$ so as to engage with each other, and the one is grounded while the other is connected to, for instance, an output port 97.

In the 3IDT-LCMR thus structured, an electric signal inputted into one input side IDT (for instance, 91, 93) is converted into a surface acoustic wave to propagate to the other output side IDT (for instance, 92), so that the surface acoustic wave is taken out by being reversely converted into an electric signal on this output side IDT. Thus, the output phase and the input phase can be reversed by 180 degrees according to the difference between the electrode arrangement of the input side IDT and the electrode arrangement of the output side IDT. Furthermore, it is possible to modify the propagation characteristics of the surface acoustic wave, that is the filter frequency characteristic or the like according to the difference in pitch, shape, or the like of electrode fingers forming the comb electrode of the IDT.

As another circuit system which can carry out unbalanced balanced conversion, there is a technology such that a balanced type surface acoustic wave filter connecting both a series arm surface acoustic wave resonator and a parallel arm surface acoustic wave resonator in a symmetrical lattice shape is connected between a pair of electrodes of the output side IDT or the input side IDT of the SAW filter unit (for instance, see Patent Document 2).

[Patent Document 1] Japanese Patent Application Laid-open No. Hei 10-117123

[Patent Document 2] Japanese Patent Application Laid-open No. Hei 8-65098

Recently, miniaturization and lower pricing of vehicular terminals have progressed, and reduction in the number of parts of the high frequency units is an important subject. Furthermore, demand for reduction of the terminal impedance of a receive amplifier disposed at the rear stage of an SAW filter unit, from conventional high impedance of 100 Ω to several hundreds Ω to low impedance of less than 50 Ω, has also increased.

For instance, in a configuration shown in FIG. 5, a signal inputted from an antenna 1 is transmitted to a receive SAW filter unit 3 at required impedance of 50 Ω terminal impedance in an unbalanced driving by a switch 2 on the reception side, and a receive amplifier 6 in a rear stage of the SAW filter unit 3 has been required to have a terminal impedance of as low as about 30 Ω to 50 Ω in a balanced driving, in recent years. Accordingly, in the SAW filter unit 3 disposed in a front stage of the receive amplifier 6, it has been demanded that the input be 50 Ω at the terminal end in an unbalanced driving, and the output be about 30 Ω to 50 Ω in a balanced driving, and a matching circuit 5 which has been an indispensable circuit can be eliminated by realizing such an input and output impedance.

When an SAW filter unit, the terminal impedance of which is a high balanced driving output, is used to cope with these required electric performances, as in Patent Document 1, matching circuits 5 and 8 are required to be disposed between the receive amplifier 6 and a transmission amplifier 7, and the number of parts (capacitors and coils) for the matching circuits, which requires a large circuit space. Furthermore, designing and adjustment of the matching circuit becomes complicated.

Concerning to this point, in the system disclosed in Patent Document 2, the output impedance can be kept low. However, the out-of-band damping characteristic, which is an important characteristic for the SAW filter unit, is not sufficient.

SUMMARY OF THE INVENTION

An object of the present invention is to provide a surface acoustic wave filter, which can take an unbalanced balanced input output circuit structure with a characteristic of low impedance input and output by reducing the number of parts, and further can obtain a desirable characteristic for the out-of-band damping.

A surface acoustic wave filter of the present invention, including:

a longitudinal mode resonator type first surface acoustic wave filter unit provided with a central IDT electrode and respective outer IDT electrodes on both sides of the central IDT electrode, and respective reflectors further on the outsides of these outer IDT electrodes; and a longitudinal mode resonator type second surface acoustic wave filter unit provided with a central IDT electrode and respective outer IDT electrodes on both sides of the central IDT electrode, and respective reflectors further on the outsides of these outer IDT electrodes, wherein the central IDT electrode of the first surface acoustic wave filter unit and the central IDT electrode of the second surface acoustic wave filter unit are structured to have the same electrode finger arrangement; and each one terminal of these central IDT electrodes is grounded, and each of the other terminals of these central IDT electrodes is connected in parallel to each other to form an unbalanced input port or an unbalanced output port, wherein electrode fingers of a set of the outer IDT electrodes of the first surface acoustic wave filter unit and electrode fingers of a set of the outer IDT electrodes of the second surface acoustic wave filter unit are arranged in an opposite direction to each other; and a pair of ports formed by connecting four terminals in parallel, of which input-output phases are the same phase out of eight terminals of these outer IDT electrodes are made into balanced output ports or balanced input ports.

A surface acoustic wave filter of another invention, including:

a longitudinal mode resonator type first surface acoustic wave filter unit provided with a central IDT electrode and respective outer IDT electrodes on both sides of the central IDT electrode, and respective reflectors further on the outsides of these outer IDT electrodes; and a longitudinal mode resonator type second surface acoustic wave filter unit provided with a central IDT electrode and respective outer IDT electrodes on both sides of the central IDT electrode, and respective reflectors further on the outsides of these outer IDT electrodes, wherein the arrangement of one set of the electrode fingers in the outer IDT electrodes of the first surface acoustic wave filter unit and the arrangement of the electrode fingers of the outer IDT electrodes of the second surface acoustic wave filter unit are made the same arrangement; and an unbalanced input port or unbalanced output port is formed by connecting four terminals in parallel with each other, of which input-output phases are the same phase out of terminals of these outer IDT electrodes, and by grounding other terminals, wherein the central IDT electrode of the first surface acoustic wave filter unit and the central IDT electrode of the second surface acoustic wave filter unit are made opposite in direction to each other; and a pair of ports formed by connecting two terminals in parallel, of which input-output phases are the same phase out of these central IDT electrodes are made into balanced output ports or balanced input ports.

The first surface acoustic wave filter unit and the second surface acoustic wave filter unit are preferably equal in filter property.

A transmitter-receiver of the present invention, including:

a transmission amplifier outputting a high frequency signal for transmission;

a surface acoustic wave filter for transmission according to the said present invention or another invention, provided between the transmission amplifier and an antenna;

a receive amplifier into which high frequency signals received by the antenna;

the surface acoustic wave filter for reception according to the said present invention or another invention, provided between the receive amplifier and the antenna; and a switch for connecting the antenna to the surface acoustic wave filter for transmission or the surface acoustic wave filter for reception.

As described above, according to the present invention, it becomes possible to realize an unbalanced balanced input output circuit by two groups of longitudinal mode resonator type SAW filter units, to realize a characteristic of low impedance input and output by reducing the number of parts, and to obtain a desirable out-of-band damping amount characteristic.

DETAILED DESCRIPTION OF THE PREFERRED EMBODIMENT(S)

(Embodiment 1)

Figure 1:
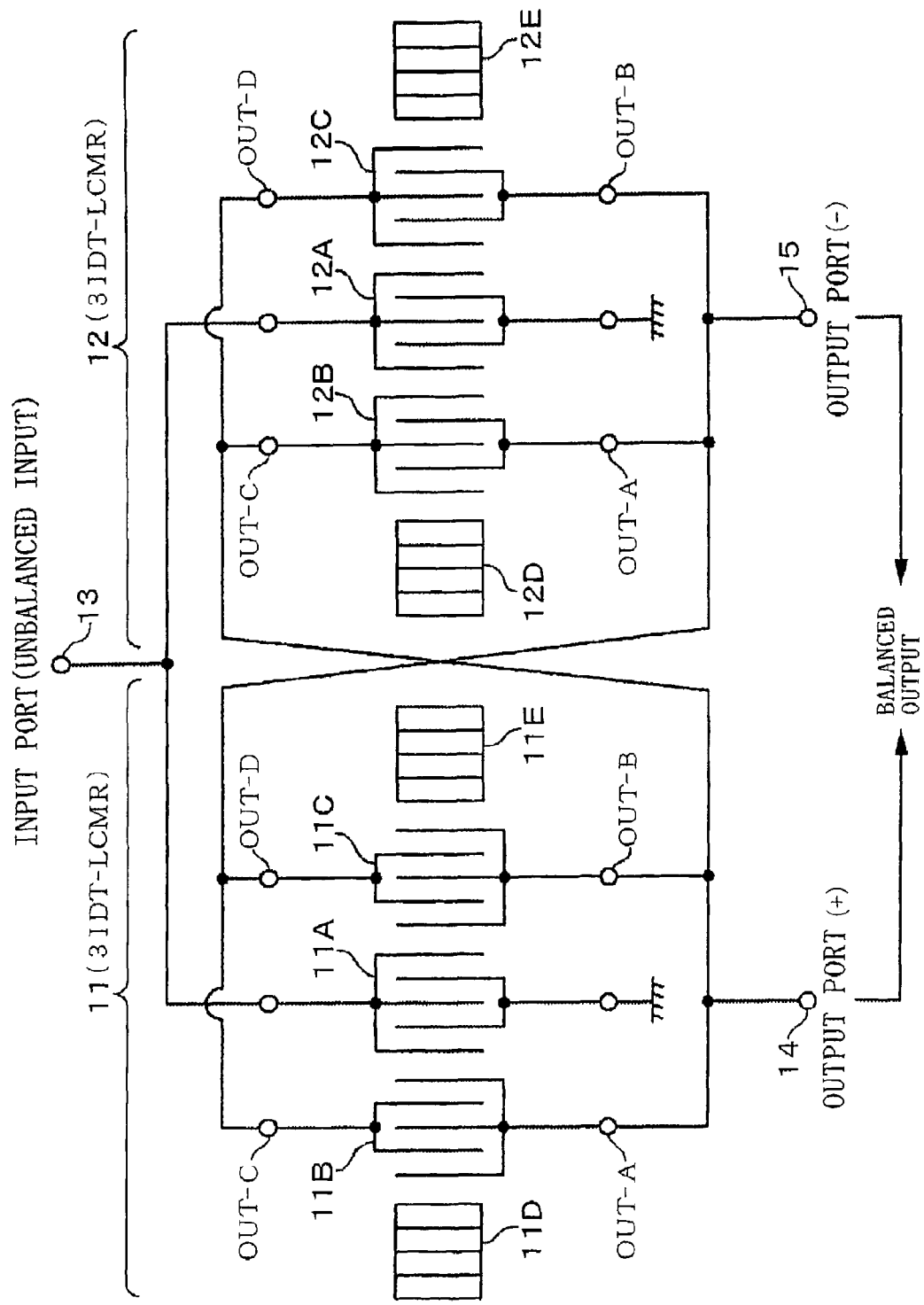
FIG. 1 is a circuit structure diagram of an SAW filter showing an embodiment 1 of the present invention.

FIG. 1 is a circuit structure diagram showing an embodiment of an SAW filter of the present invention. Two groups of 3IDT type longitudinal mode resonator type SAW filter units (3IDT-LCMR) having three IDT units are formed on a piezoelectric substrate. These SAW filter units 11 and 12 are equally structured in filter characteristics (center frequency, input output impedance, phase characteristics, gain characteristics, etc.).

In addition, the SAW filter units 11 and 12 are made to have an electrode structure different in the input-output phase by 180 degrees from each other. In other words, the SAW filter unit 11 and the SAW filter unit 12 are provided with central IDT electrodes 11A and 12A having the same electrode finger arrangement. Furthermore, outer IDT electrodes 11B and 11C which correspond to signal output sides are provided on both sides of the central IDT electrode 11A, and outer IDT electrodes 12B and 12C which correspond to signal output sides are provided on both sides of the central IDT electrode 12A. The electrode fingers of the outer IDT electrodes 12B and 12C group are structured to have reverse electrode finger arrangement to those of the outer IDT electrodes 11B and 11C group. Note that 11D, 11E, 12D, and 12E are grating reflectors.

The central IDT electrode 11A of the SAW filter unit 11 and the central IDT electrode 12A of the SAW filter unit 12 are structured to form an unbalanced input circuit in which both electrodes are electrically connected in parallel at one terminal, and are grounded at the other terminal, and is connected to an unbalanced input port 13. When an input signal is applied to the unbalanced input port 13, output terminals OUT-A and OUT-B of the outer IDT electrodes 11B and 11C of the SAW filter unit 11 output signals in the same phase as the input signal, and output terminals OUT-C and OUT-D output signals in an opposite phase (different by 180 degrees) to the input signal.

Whereas, in the SAW filter unit 12, since the arrangement of the electrode fingers of the outer IDT electrodes 12B and 12C group are taken in an opposite direction to the arrangement of the electrode fingers of the outer IDT electrodes 11B and 11C group of the SAW filter unit 11 so that the input-output phase is made different by 180 degrees, when an input signal is applied, the output terminals OUT-A and OUT-B of the outer IDT electrodes 12B and 12C of the SAW filter unit 12 output signals in an opposite phase (different by 180 degrees) to the input signal, and the output terminals OUT-C and OUT-D output signals in the same phase as the input signal.

Accordingly, when the output terminals OUT-A, OUT-B of the SAW filter unit 11, and the output terminals OUT-C, OUT-D of the SAW filter unit 12 are electrically connected with wiring or the like to be an output port (+) 14, and similarly, the output terminals OUT-A, OUT-B of the SAW filter unit 12, and the output terminals OUT-C, OUT-D of the SAW filter unit 11 are electrically connected with wiring or the like to be an output port (−) 15, these output port (+) 14 and output port (−) 15 come to a balanced output terminal.

By structuring the SAW filter units as described above, two groups of the SAW filter units are connected in parallel to the input port 13 as loads, and assuming that the impedance of both loads are 100 Ω respectively, the input impedance taken at the input port 13 is reduced by half of 50 Ω. Nevertheless, some changes occur according to the existence of the input impedance of a load connected to the output ports 14 and 15.

Whereas, in the output port (+) 14, since the output terminals OUT-A and OUT-B of the SAW filter unit 11, and the output terminals OUT-C and OUT-D of the SAW filter unit 12 having the same phase as these output terminals OUT-A and OUT-B are connected in parallel, four IDT electrodes as the load are connected in parallel, and assuming that the impedance of each load is 100 Ω each, the output impedance taken at the output port (+) 14 comes to 25 Ω. Similarly, in the output port (−) 15, since the output terminals OUT-A and OUT-B of the SAW filter unit 12, and the output terminals OUT-C and OUT-D of the SAW filter unit 11 having the same phase as these output terminals OUT-A and OUT-B are connected in parallel, four IDT electrodes as the load are connected in parallel, and assuming that the impedance of each load is 100 Ω each, the output impedance taken at the output port (−) 15 comes to 25 Ω. Accordingly, as a balanced output of the output port (+) 14 and the output port (−) 15, output impedance of 25 Ω can be obtained. Nevertheless, some changes occur according to the existence of the output impedance of a signal source connected to the input ports 13.

It should be noted that the design modification of the input-output impedance of respective IDTs can be appropriately carried out according to the arrangement and structure of the electrode fingers, and it is possible to obtain the terminal output of, for instance, 30 to 50 Ω.

Therefore, the SAW filter unit according to the present embodiment can realize an unbalanced input and a balanced output, which needs no matching circuit. It needs only two sets of 3IDTs as for the number of parts, and can obtain a characteristic having lowered impedance for both input and output.

Figure 2:
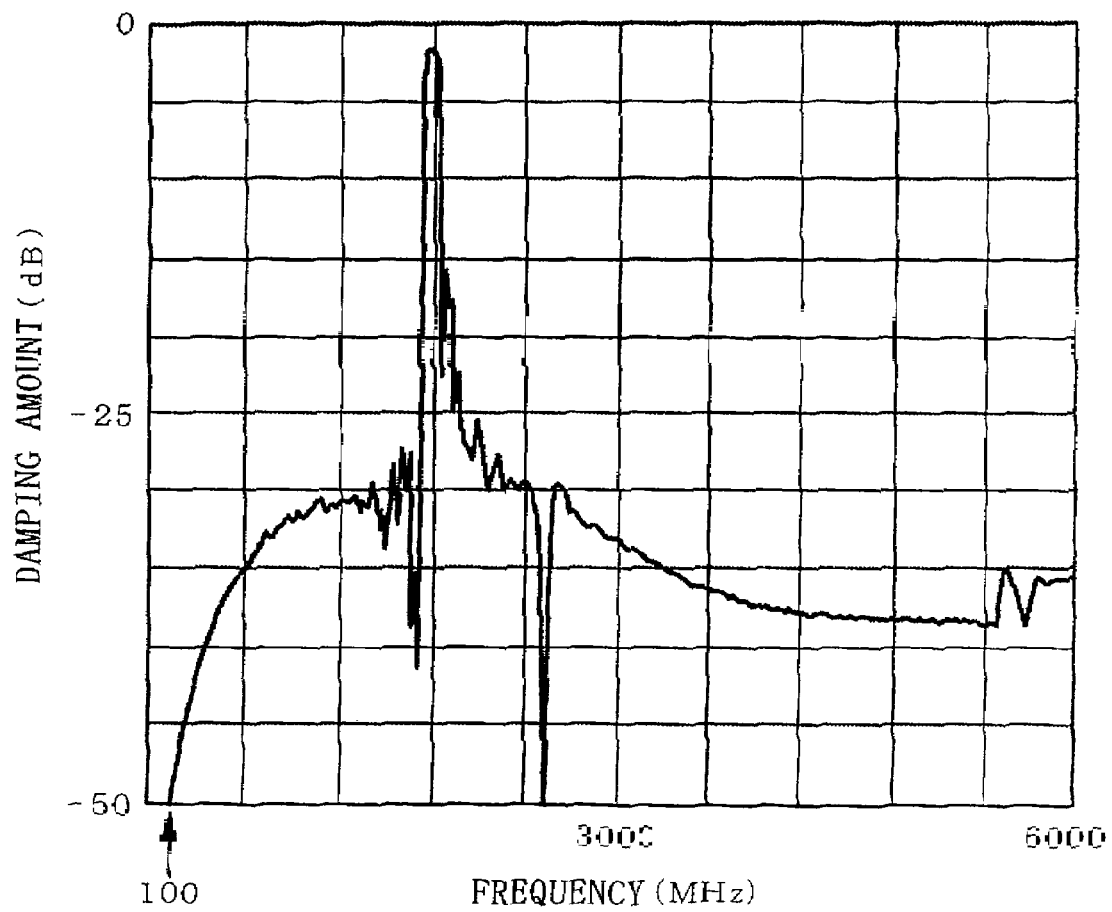
FIG. 2 is a characteristic chart showing an example of damping characteristics of the SAW filter in the embodiment 1.
Figure 3:
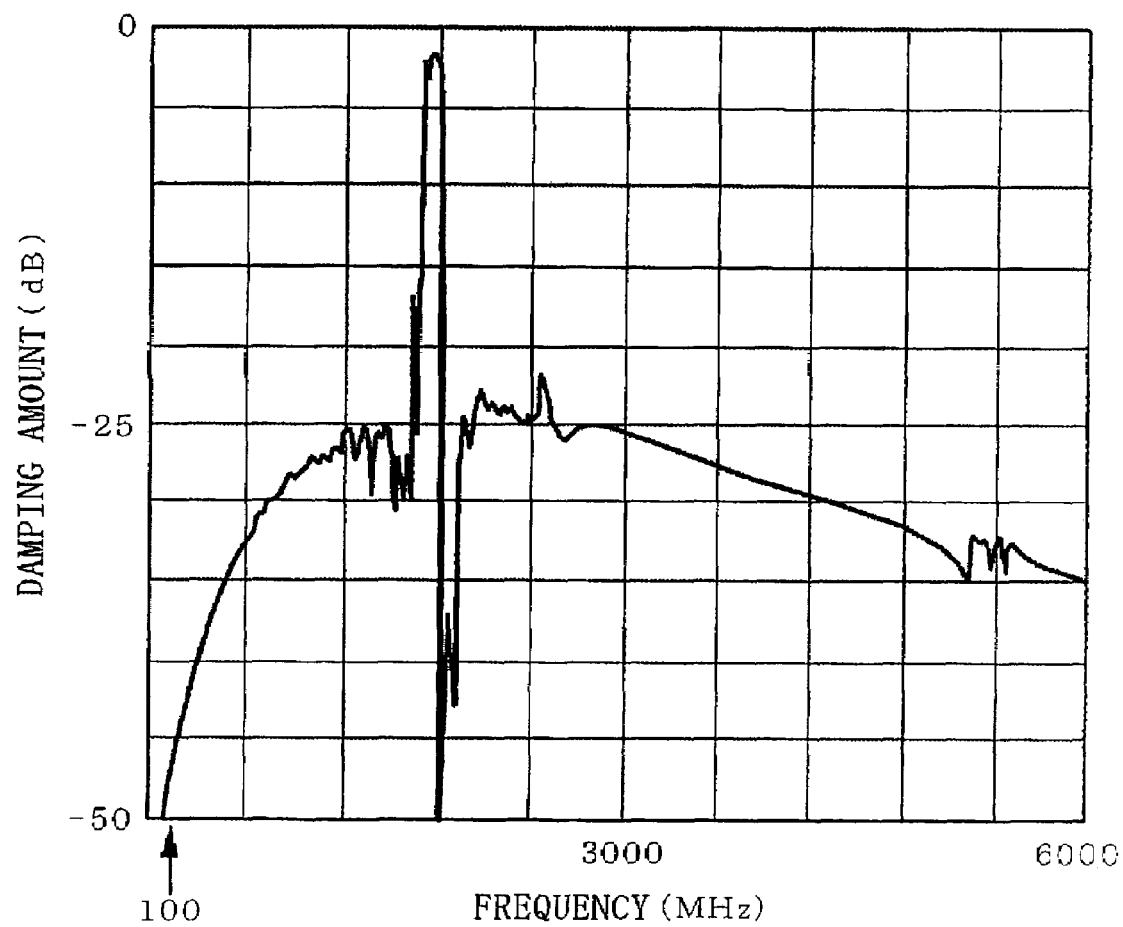
FIG. 3 is a characteristic chart showing an example of damping characteristics of a conventional SAW filter.

Furthermore, the SAW filter unit according to the present embodiment is prepared and its out-of-band damping amount characteristic is measured. As a result, an improved characteristic compared with the conventional SAW filter unit was obtained. FIG. 2 shows an example of damping characteristics of the SAW filter unit in the present embodiment to be from 40 MHz to 6 GHz, and FIG. 3 shows an example of damping characteristics of the SAW filter unit in Patent Document 2. When damping characteristics ranging from 40 MHz to 1.7 GHz in FIG. 2, and ranging from 2 GHz to 6 GHz in FIG. 3 are compared, the damping amount in FIG. 2 is largely improved by about 5 dB than in FIG. 3.

(Embodiment 2)

Figure 4:
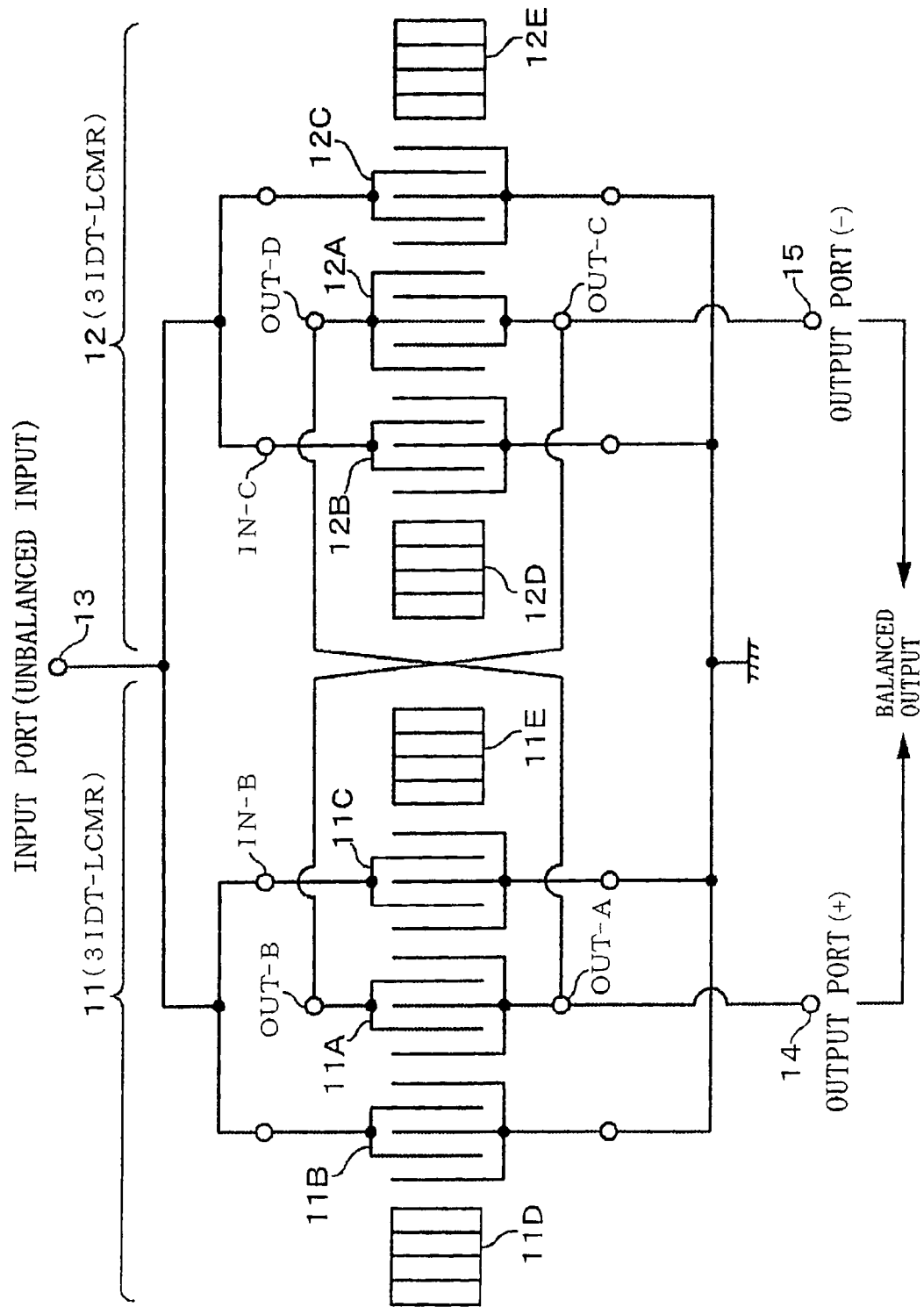
FIG. 4 is a circuit structure diagram of an SAW filter showing an embodiment 2 of the present invention.

FIG. 4 shows another embodiment of the present invention. The electrode fingers of the outer IDT electrodes 12B and 12C group are arranged in reverse to the arrangement of electrode fingers of the outer IDT electrodes 11B and 11C group in the first embodiment. But in this embodiment, the outer IDT electrodes 11B, 11C group and the outer IDT electrodes 12B, 12C group have the same electrode finger arrangement. Furthermore, though the central IDT electrodes 11A and 12A take the same electrode finger arrangement in the first embodiment, the arrangement of electrode fingers of the central IDT electrode 12A is in reverse to that of electrode fingers of the central IDT electrode 11A.

The two outer IDT electrodes 11B, 11C of the SAW filter unit 11 and the two outer IDT electrodes 12B, 12C of the SAW filter unit 12 are electrically connected in parallel with wiring or the like at one terminal and are connected to the unbalanced input port 13. The outer IDT electrodes 11B, 11C, 12B and 12C are grounded at the other terminal. When input signals are applied to the unbalanced input port 13, one output terminal OUT-A of the central IDT electrode 11A of the SAW filter unit 11 outputs in a reverse phase to the input signal, and the other output terminal OUT-B outputs in the same phase as the input signal.

On the contrary, in the SAW filter unit 12, since the electrode arrangement of the central IDT electrode 12A is taken in a reverse direction to that of the central IDT electrode 11A of the SAW filter unit 11, so that the input-output phase is made different by 180 degrees, when an input signal is applied, the output terminal OUT-C of the central IDT electrode 12A of the SAW filter unit 12 outputs in a reverse phase to the input signal, and the output terminal OUT-D outputs in the same phase as the input signal.

The output terminal OUT-A of the SAW filter unit 11 and the output terminal OUT-D of the SAW filter unit 12 are electrically connected with wiring or the like to be the output port (+) 14. Similarly, the output terminal OUT-C of the SAW filter unit 12 and the output terminal OUT-B of the SAW filter unit 11 are electrically connected with wiring or the like to be the output port (−) 15. Thus, these output port (+) 14 and the output port (−) 15 serve as balanced output terminals.

By adopting the above-described structure, the electrode fingers of the two outer IDT electrodes 11B, 11C of the SAW filter unit 11 and the two outer IDT electrodes 12B, 12C of the SAW filter unit 12 are arranged in the same direction. When each one terminal end side of the respective electrodes are connected in parallel to each other, the other end sides are also connected in parallel, and signals are applied from the input port 13, output in the same phase as the input signal appear at the output terminals OUT-A, OUT-D, and output in a reverse phase to that of the input signal appear at the output terminals OUT-B, OUT-C.

In the case of taking this configuration, since four outer electrodes are connected in parallel in respect of the input port 13, the input impedance can be reduced to, for instance, one fourth. Whereas, since two central IDT electrodes having the same phase are connected in parallel in respect of the output ports 14, 15, the output impedance can be reduced, for instance, by half.

Accordingly, when the output terminals OUT-A, OUT-D are connected to the output port (+) 14, and the output terminals OUT-B, OUT-C are connected to the output port 15 with wiring or the like, in the case of applying, for instance, an unbalanced input signal of 50 Ω into the port 1, a balanced output of 30 to 50 Ω at the terminals can be obtained between the ports 14 and 15, by adjusting parameter of the SAW filter units 11 and 12.

In the present embodiment, it comes to an unbalanced input and balanced output, only two groups of 3IDTs are sufficient as the number of parts, and moreover, it is possible to obtain characteristics realizing lowered impedance for both input and output. Further, improvement in the out-of-band damping amount can be expected.

It should be noted that in the embodiments described above, the same operational effect can be obtained by performing appropriate design modification on the electrode structures of the respective two groups of 3IDTs (difference of the same phase and the opposite phase to the input port, and difference of the same phase and the opposite phase to the output port) and the wire connection structure between these electrodes.

Figure 5:
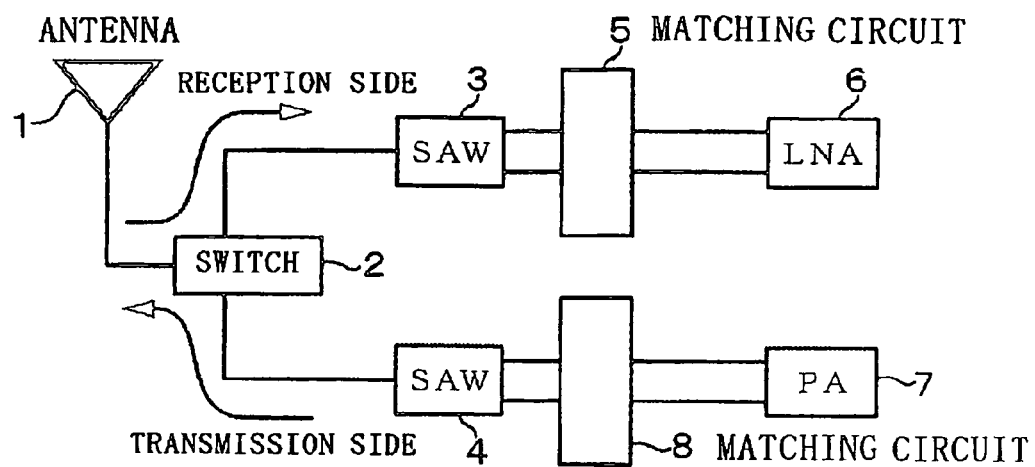
FIG. 5 is a structural example of a front end unit of a vehicular terminal.
Figure 6:
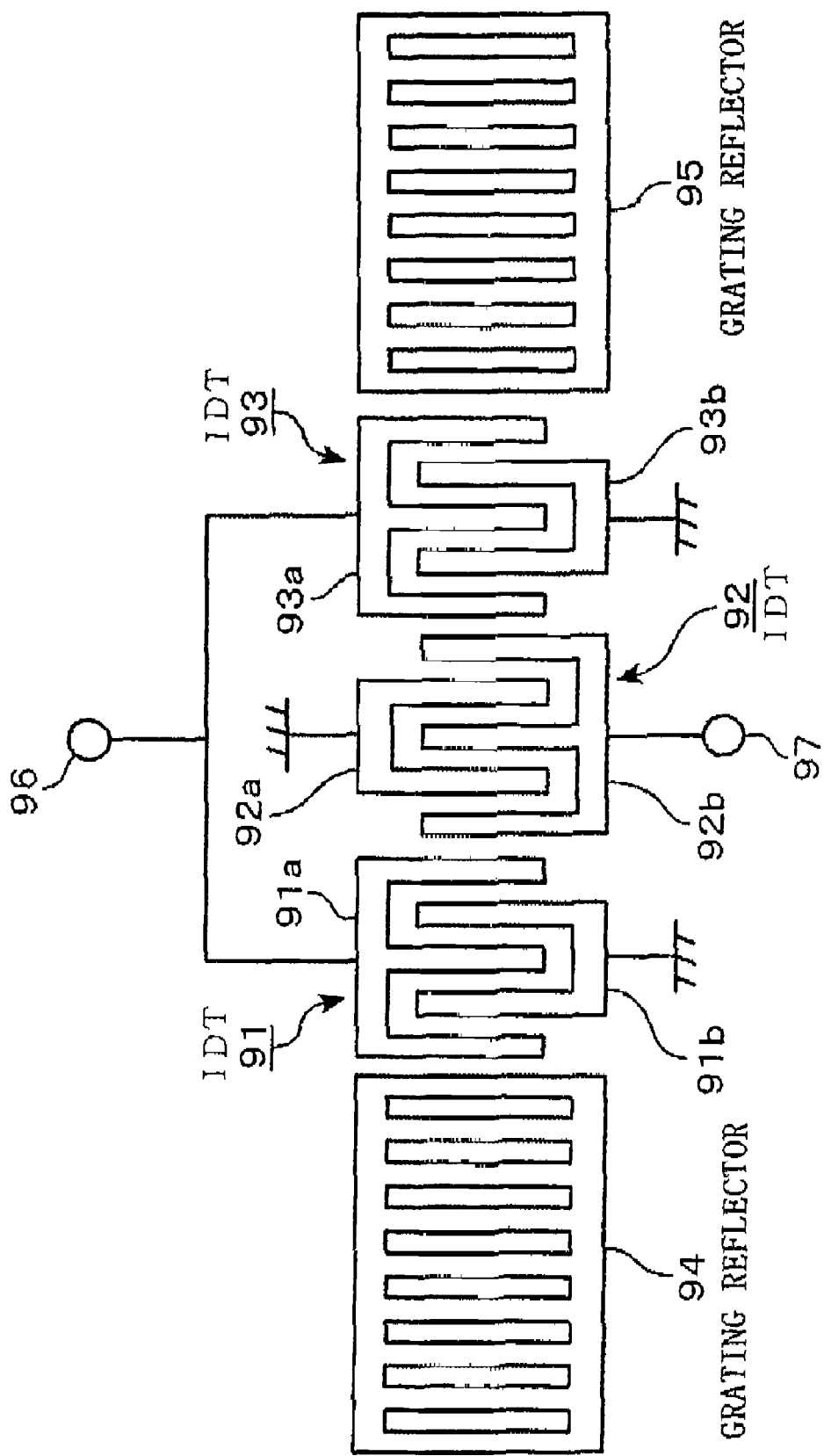
FIG. 6 is a structure diagram showing an example of a 3IDT type longitudinal mode resonator type SAW filter unit (3IDT-LCMR).

In addition, though the present embodiment shows the case of structuring the SAW filter unit to perform unbalanced input and balanced output, it is also applicable as a filter which requires balanced input and unbalanced output, and lowered impedance for both input and output, similarly to the SAW filter unit 4 in FIG. 5.

Since a matching circuit becomes unnecessary if the SAW filter of the present invention is used, the transmitter-receiver is structured eliminating the matching circuits 5 and 8 in the structure shown in FIG. 5. In this case, the SAW filter of the present invention is used as for the SAW filter units 3 and 4.

What is claimed is:

1. A surface acoustic wave filter, comprising:
   a longitudinal mode resonator type first surface acoustic wave filter unit provided with a central IDT electrode and respective outer IDT electrodes on both sides of the central IDT electrode, and respective reflectors further on the outsides of said outer IDT electrodes; and
   a longitudinal mode resonator type second surface acoustic wave filter unit provided with a central IDT electrode and respective outer IDT electrodes on both sides of the central IDT electrode, and respective reflectors further on the outsides of said outer IDT electrodes,
   wherein the central IDT electrode of said first surface acoustic wave filter unit and the central IDT electrode of said second surface acoustic wave filter unit are structured to have the same electrode finger arrangement;
   each one terminal of said central IDT electrodes is grounded, and each of the other terminals of said central IDT electrodes is connected in parallel to each other to form an unbalanced input port or an unbalanced output port;
   electrode fingers of a set of the outer IDT electrodes of said first surface acoustic wave filter unit and electrode fingers of a set of the outer IDT electrodes of said second surface acoustic wave filter unit are arranged in an opposite direction to each other; and
   a pair of ports formed by connecting four terminals in parallel, of which input-output phases are the same phase out of eight terminals of said outer IDT electrodes are made into balanced output ports or balanced input ports.

2. A surface acoustic wave filter, comprising:
   a longitudinal mode resonator type first surface acoustic wave filter unit provided with a central IDT electrode and respective outer IDT electrodes on both sides of the central IDT electrode, and respective reflectors further on the outsides of said outer IDT electrodes; and
   a longitudinal mode resonator type second surface acoustic wave filter unit provided with a central IDT electrode and respective outer IDT electrodes on both sides of the central IDT electrode, and respective reflectors further on the outsides of said outer IDT electrodes,
   wherein the arrangement of one set of the electrode fingers in the outer IDT electrodes of said first surface acoustic wave filter unit and the arrangement of the electrode fingers of the outer IDT electrodes of the second surface acoustic wave filter unit are made the same arrangement; and
   an unbalanced input port or an unbalanced output port is formed by connecting four terminals in parallel with each other, of which input-output phases are the same phase out of terminals of said outer IDT electrodes, and by grounding other terminals;
   the central IDT electrode of said first surface acoustic wave filter unit and the central IDT electrode of the second surface acoustic wave filter unit are made opposite in direction to each other; and
   a pair of ports formed by connecting two terminals in parallel, of which input-output phases are the same phase out of said central IDT electrodes are made into balanced output ports or balanced input ports.

3. The surface acoustic wave filter according to claim 1 or claim 2, wherein said first surface acoustic wave filter unit and said second surface acoustic wave filter unit are equal in filter property.

4. A transmitter-receiver of the present invention, comprising;
   a transmission amplifier outputting a high frequency signal for transmission;
   a surface acoustic wave filter for transmission according to clam 1 or claim 2, provided between the transmission amplifier and an antenna;
   a receive amplifier into which high frequency signals received by said antenna;
   the surface acoustic wave filter for reception according to claim 1 or claim 2, provided between the receive amplifier and the antenna; and
   a switch for connecting said antenna to the surface acoustic wave filter for transmission or the surface acoustic wave filter for reception.

* * * * *